United States Patent [19]
Wiest et al.

[11] Patent Number: 5,640,120
[45] Date of Patent: Jun. 17, 1997

[54] POLARIZATION CURRENT CONTROLLED ELECTRONIC CIRCUIT SUCH AS AN ADJUSTABLE RESISTANCE, A NEGATIVE RESISTANCE OR A FILTER OR SIMILAR

[75] Inventors: Francis Wiest, Magny; Alain Fabre, Antony, both of France

[73] Assignee: Unites Conceptions et Integrations en Microelectronique, Palaiseau, France

[21] Appl. No.: 553,301
[22] PCT Filed: May 20, 1994
[86] PCT No.: PCT/FR94/00604
§ 371 Date: Dec. 21, 1995
§ 102(e) Date: Dec. 21, 1995
[87] PCT Pub. No.: WO94/28626
PCT Pub. Date: Dec. 8, 1994

[30] Foreign Application Priority Data

May 21, 1993 [FR] France ................... 93 06121

[51] Int. Cl.$^6$ .................. G06G 7/12; H02M 11/00
[52] U.S. Cl. .................. 327/334; 327/103; 330/267
[58] Field of Search ................... 327/538, 108, 327/103, 334, 427, 478, 552, 553, 363; 330/267, 288; 323/315

[56] References Cited

U.S. PATENT DOCUMENTS

| | | | |
|---|---|---|---|
| 3,852,678 | 12/1974 | Frye | 330/265 |
| 4,394,625 | 7/1983 | Sakai | 330/267 |
| 4,816,773 | 3/1989 | Pricer | 330/267 |
| 5,140,282 | 8/1992 | van Mil et al. | 330/267 |

*Primary Examiner*—Toan Tran
*Attorney, Agent, or Firm*—Young & Thompson

[57] ABSTRACT

Electronic circuit comprising at least one first second-generation current conveyer consisting of a mixed translinear loop and a plurality of current mirrors. The conveyer includes a high impedance reference port, an input port with an intrinsic resistance equivalent to the output resistance of the equivalent Thevenin generator, seen by the input port and polarized by a polarization current, an output port with a current corresponding to that of the input port and a current controller for controlling the intensity of the polarization current to determine the ohmic value of the intrinsic resistance. The invention's reference and output ports are directly connected to one another.

10 Claims, 4 Drawing Sheets

POLARIZATION CURRENT CONTROLLED ELECTRONIC CIRCUIT SUCH AS AN ADJUSTABLE RESISTANCE, A NEGATIVE RESISTANCE OR A FILTER OR SIMILAR

BACKGROUND OF THE INVENTION

The present invention concerns electronic circuits comprising at least one second-generation current conveyor made up of a mixed translinear loop and a plurality of current mirrors. As is known in the art, such a conveyor has an input port, an output port and a high-impedance reference port.

Second-generation current conveyors are well known in the art of microelectronics, particularly for the embodiment of integrated circuits. It is known that they are generally used because of their impedance modifying qualities. Indeed, a current applied to the input port appears in identical form at the output port in the case of a positive second-generation current conveyor (referred to as CCII+ henceforth), or inverted in the case of a negative second-generation current conveyor (referred to as CCII– henceforth), the output port displaying an impedance different from that of the input port. The reference port displays an extremely high impedance and therefore makes up a voltage reference.

A variety of documents describe such conveyors. For example, documents U.S. Pat. No. 3,619,798, U.S. Pat. No. 3,582,689, and EP-A-0 383 397 describe such current conveyors.

All of the documents mentioned above propose significant improvements for such current conveyors, but they do not truly concerned with the range of applications of these conveyors.

Other documents such as the INTERNATIONAL JOURNAL OF ELECTRONICS, volume 65, no 6, December 1988, pages 1203–1208, and IEEE TRANSACTIONS ON CIRCUITS AND SYSTEMS, volume 39, no, 2, February 1992, concern electronic circuits which comprise current conveyors and whose purpose is to amplify currents.

Document U.S. Pat. No. 5,124,666 concerns a second-generation current conveyor suitable for a MOS integrated circuits technology intended to embody bandpass filters and other types of filters using second-order transfer functions without operational amplifiers.

The document "Electronics letters", volume 24, no. 9, of Apr. 28, 1988, pages 548–549, concerns a current conveyor whose gain can be controlled according to the polarization current.

Document EP-A-0 454 253 concerns a current amplifier comprising a current conveyor in which, amongst other things, the sources of polarization current can be variable.

Finally, the document "Electronics letters", volume 20, no. 17, of Oct. 16, 1984, pages 674–676, describes an electronic circuit including at least one current conveyor in which the ratio between the output signal and the input signal can be controlled by a polarization current.

Now, there is a need for the embodiment of simple electronic circuits which use one or more current conveyors making it possible to obtain a maximum integration of these circuits.

SUMMARY OF THE INVENTION

The first goal of the present invention is to embody electronic circuits which include current conveyors and whose characteristics can be adjusted according to simple parameters, such the polarization currents of the conveyors, for example.

More particularly, it is difficult to embody an adjustable resistor in an integrated circuit due to the fact that it is at present impossible to control such a resistor in a precise manner.

Another goal of the present invention is therefore to embody an adjustable resistor which can be controlled in a precise manner according to the same simple parameter and which takes up a minimum amount of space.

Another goal of the present invention is to use, as an adjustable resistor, an intrinsic resistance induced by the design of the current conveyor, for which the prior art teaches that it interferes with the proper operation of the conveyor and which, as a result, should be minimised.

A current conveyor has an input port (X), an output port (Z) and a reference port (Y). The conveyor is polarized by a polarization current (I), As is also known, the output port (Z) duplicates the current applied to the input port (X) so as to obtain: $I_z=I_x$ (CCII+) or $I_z=-I_x$ (CCII–).

Another object of the invention is an electronic circuit comprising at least one first second-generation current conveyor made up of a mixed translinear loop and a plurality of current mirrors, said conveyor having a high-impedance reference port, an input port with an intrinsic resistance equivalent to the output resistance of the equivalent Thevenin-type generator at said input port and which is polarized by a polarization current, an output port whose current corresponds to that of the input port, and means to control the intensity of the polarization current, so as to determine the ohmic value of the intrinsic resistance.

According to a first aspect, the invention concerns an electronic circuit such as described above, in which the reference and output ports of the conveyor are directly connected together. The electronic circuit therefore makes up a negative adjustable resistor in the case of a CCII(–) type conveyor and a positive adjustable resistor in the case of a CCII(+) type conveyor.

According to a second aspect, the invention concerns an electronic circuit such as described above, with at least one of the ports of the conveyor connected to ground.

According to a third aspect, another object of the invention is a controllable-gain current amplifier using a current conveyor making up a resistor such as previously indicated. According to the invention, the first conveyor is arranged as previously indicated so as to make up an adjustable resistor, the reference port being connected to ground. The input port of this first conveyor is connected to a source of current and to the reference port of a second second-generation current conveyor similar to the first, whose input port is connected to ground in such a way that the current applied to the output port of the second conveyor is equal to the current delivered by the source of current multiplied by a multiplying coefficient dependent on the ratio of the polarization currents of each of the conveyors. The amplifier which has just been described immediately becomes a mixer, since the polarization current of the second conveyor and the current delivered by the source of current previously mentioned are alternating currents.

According to a fourth aspect, another object of the invention is a controllable-gain voltage amplifier using a current conveyor making up a resistor such as previously indicated. According to the invention, the input port of the first conveyor is connected to ground, the reference port is connected to a source, and the output port is connected to the first input port of a second second-generation current conveyor including a reference port connected to ground, a second input port which duplicates the input voltage of the input port in such a way that the voltage at the first and second input ports of the second conveyor is equal to the voltage delivered by the source of voltage multiplied by a coefficient dependent on the ratio of the polarization currents of each of the conveyors.

According to another aspect, an object of the invention is a self-inductance simulation circuit including two second-generation conveyors of the same type as the first conveyor described.

The self-inductance simulation circuit displays a particularity in that it can be adjusted by modifying at least one of the polarization currents applied to said conveyors.

The self-inductance simulation circuit includes an input terminal, another terminal connected to ground and, furthermore, a second and third second-generation current conveyors made up of a mixed translinear loop and a plurality of current mirrors, respectively, the conveyors respectively having a high-impedance reference port, an input port with an intrinsic resistance equivalent to the output resistance of the equivalent Thevenin-type generator, at said input port, and being respectively polarized by a polarization current, and an output port whose current corresponds to that of the input port, and means to control the intensity of the polarization currents so as to determine the ohmic value of said intrinsic resistance, either one of the input or reference port of the second conveyor being connected, on the one hand, to one terminal of a capacitor whose other terminal is connected to ground and, on the other hand, to either one of the input or output port of the third conveyor, and the input terminal of the self-inductance simulation circuit consisting of the connecting point between either one of the input or output port of the second conveyor and either one of the input or reference port of the third conveyor.

According to a last aspect, the invention concerns an adjustable bandpass filter using a resistor such as previously indicated, as well as a plurality of second-generation current conveyors substantially identical to one another, the first conveyor used being connected as a negative resistor, such as previously indicated. According to the invention, the output and reference ports of this first conveyor are connected to ground via a first capacitor, while its input port is connected to ground; this circuit further comprises a self-inductance simulation circuit, such as previously described, whose input is connected, on the one hand, to the connecting point between the first capacitor and the output and reference ports of the first conveyor and, on the other hand, to a terminal of a resistor, so as to thus embody a bandpass filter whose characteristics can be adjusted by modifying at least one of the polarization currents applied to said conveyors.

According to a first aspect, the bandpass filter described above is in voltage mode: the input of the circuit consists of the free terminal of the resistor to which an input voltage is applied, while the output of the circuit consists of the reference port of the first conveyor from which an output voltage is drawn.

According to a second aspect, the bandpass filter described above is in current mode: the input of the circuit consists of the reference port of the first conveyor to which an input current is applied, and the output of the circuit consists of the free terminal of the resistor from which an output current is drawn.

In current mode, this bandpass filter can further comprise a fourth second-generation current conveyor of the same type as the first conveyor, whose input port is connected to the free terminal of the resistor, with the reference port connected to ground, the output of the circuit consisting of the output port of said fourth conveyor from which an output current is drawn, while the input of the circuit consists of the input port of the first conveyor to which an input current is applied. This fourth conveyor being mainly intended to perform an output impedance matching of the bandpass filter in current mode.

BRIEF DESCRIPTION OF THE DRAWINGS

The invention will be better understood and further goals, advantages and characteristics will appear more clearly upon reading the description which follows of the preferred embodiments, provided on a non limiting basis, to which three sheets of drawings are attached, in which.

DETAILED DESCRIPTION OF THE INVENTION

Figure 1:
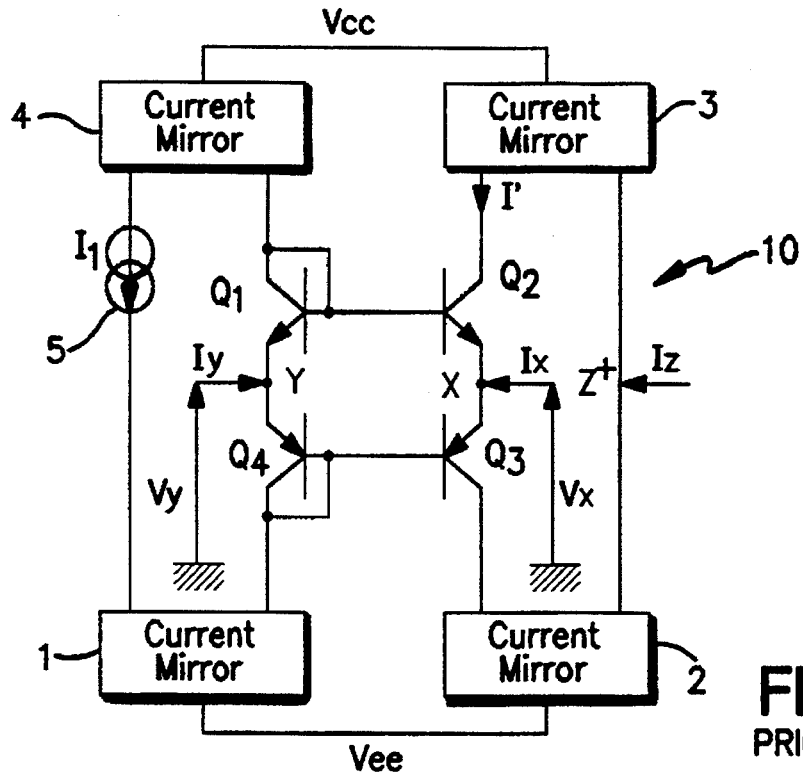
FIG. 1 is a schematic representation of a known positive second-generation current conveyor (CCII+) such as is used in the present invention.

Referring to the figures, FIG. 1 is a schematic representation of a positive second-generation current conveyor (CCII+) such as is known in the art. Such a conveyor includes four current mirrors indicated by reference numbers 1, 2, 3 and 4, and a mixed translinear loop. The loop is embodied in a known manner by means of four transistors Q1, Q2, Q3 and Q4, of which two, Q1 and Q4, have their base-collector junction short-circuited to make up some diodes. This embodiment has the particular advantage of yielding identical characteristics for the diodes and the base-transmitter junctions of the transistors. The polarization of the conveyor is obtained by means of a current source 5. The conveyor has an input port X receiving a current $I_x$ under a voltage $V_x$. A current $I_z$ equal to current $I_x$ is generated at output port $Z^+$. Port Y is a reference port serving a potential defining purpose since it has an extremely high input impedance, the current $I_y$ applied to this port being substantially nil.

Figure 2:
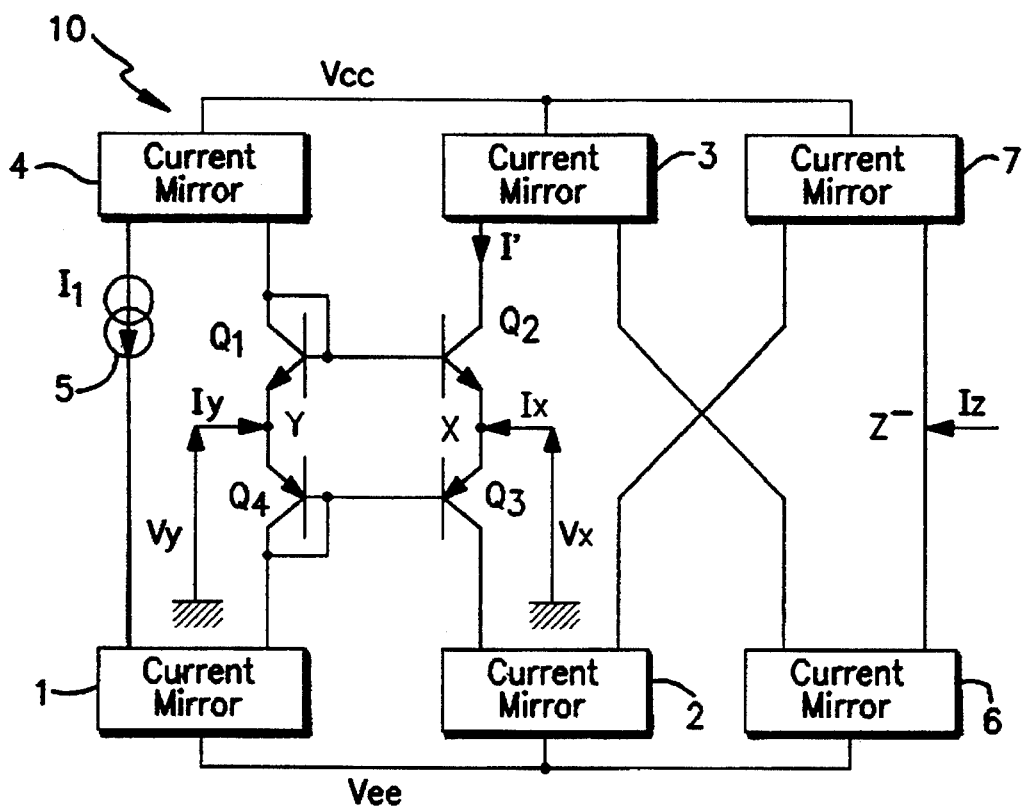
FIG. 2 is a schematic representation of a known negative second-generation current conveyor (CCII−) such as is used in the present invention.

FIG. 2 is a schematic representation of a negative second-generation current conveyor (CCII−) such as is known in the art. In comparison with the previous CCII+, the CCII− includes two additional mirrors 6, 7 such that, the conveyor having an input port X receiving a current $I_x$ under a voltage $V_x$, a current $I_z$ which is the inverse of current $I_x$ is generated at output port $Z^-$.

The second-generation current conveyors will not be described in greater detail herein since it is considered that they are already known as such by those skilled in the art who, if necessary, can refer to the documents mentioned above to obtain information on their operation and other technical details.

Figure 3A:
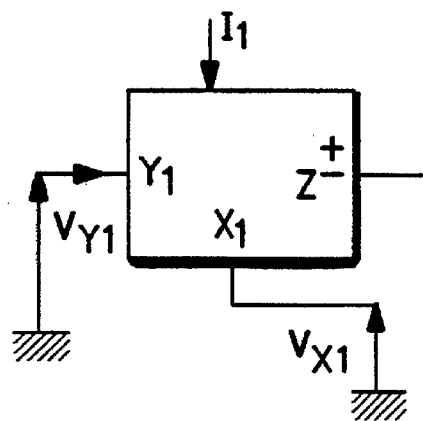
FIGS. 3a and 3b are schematic representations of an electronic circuit using the current conveyor of FIG. 1 to embody an adjustable resistor.
Figure 3B:
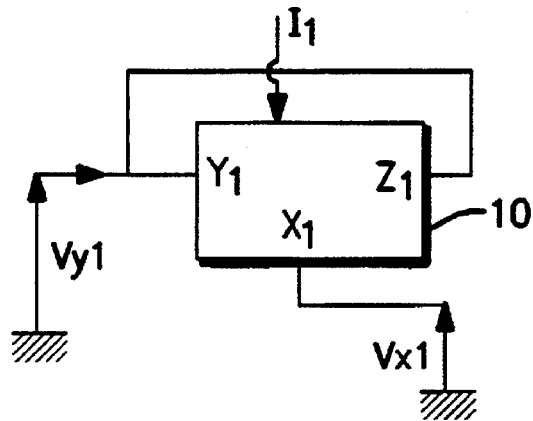

Referring to FIGS. 3a, 3b, the current conveyors are shown in block diagram form so as to simplify the figures. Likewise, each figure can represent a CCII+ or a CCII−. As we can see:

$$V_{x1} = V_{y1} + R \cdot I_x$$

The resistance R present at $X_1$ is equivalent to the output resistance of the Thevenin-type generator at $X_1$. The resistance R is equivalent to the output resistance of the transmitters of transistors $Q_2$ and $Q_3$ arranged in parallel. As a first approximation, R can be obtained from the equation:

$$R \# V_T / 2\Gamma$$

where $V_T$ is the thermodynamic potential (26 mV at $27_1$ C, for example), and $\Gamma$ is the polarization current of the transistors Q2, Q3, and is dependent on $I_1$, the polarization current of the conveyor. This resistance R is thus inversely proportional to the polarization current $I_1$ and can therefore be adjusted by means of this current.

In the case of FIG. 3a, looking at the circuit from input $X_1$ towards $Y_1$, it can be seen that, regardless of whether the conveyor is CCII+ or CCII−, the resistance R, whose ohmic value is dependent on $I_1$, will be positive.

In the case of FIG. 3b, in which the output $Z_1$ is looped onto reference $Y_1$, and looking at the circuit from the common terminal $Y_1+Z_1$ towards $X_1$, it can be seen that with a CCII+ a negative resistance R is obtained whose ohmic value is dependent on $I_1$, and that with a CCII− a positive resistance R is obtained whose ohmic value is dependent on $I_1$.

This resistance can also be referenced with respect to ground by connecting the output port $Z_1$ and reference port $Y_1$ directly to ground, i.e. by making the voltage $V_{y1}$ equal to 0.

Figure 4:
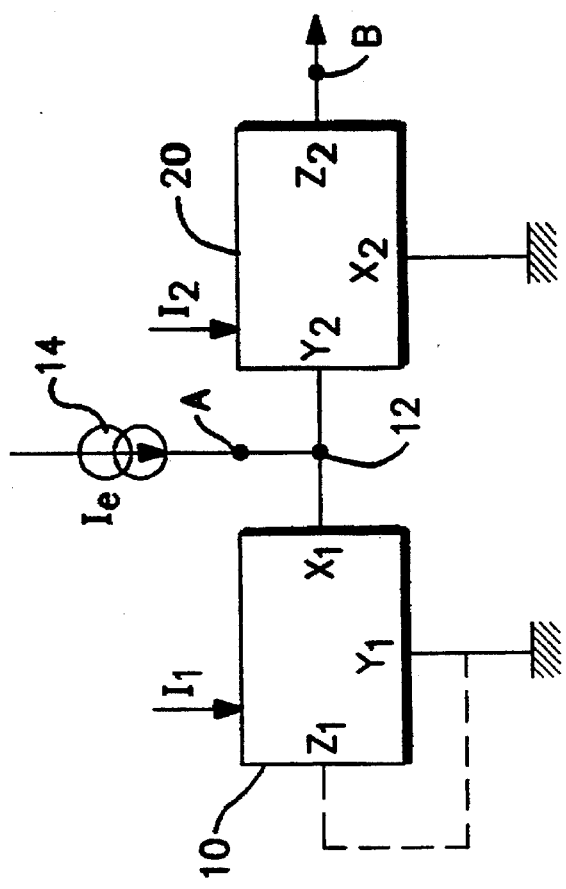
FIG. 4 is a schematic representation of an electronic circuit comprising two current conveyors connected so as to make up a controllable-gain current amplifier.

Referring to FIG. 4, the conveyor 10 is connected according to the teaching described with reference to FIG. 3a, the reference port $Y_1$ of this first conveyor 10 being connected to ground. There is thus between the reference port $Y_1$ and the input port $X_1$ a resistance which can be adjusted by means of the polarization current $I_1$.

In FIG. 4, the input port $X_1$ of the first conveyor 10 is connected to the reference port $Y_2$ of a second conveyor 20. The input port $X_2$ of this second conveyor 20 is connected to ground. This second conveyor 20 is polarized by a polarization current 12. The junction point of the input port $X_1$ of the first conveyor 10 and of the reference port $Y_2$ of the second conveyor 20, indicated by reference number 12, is connected to a current generator 14 generating a current $I_e$. The voltage at the junction point 12 can therefore be written as $V = R_1 \cdot Ie$. Now, the output current of the circuit in Z2 is equal to $V/R_2$; we thus obtain $I_{z2} = I_e \cdot R_1 / R_2$. As we have seen that Ri is equal, according to a first approximation, to the thermodynamic potential $V_T$ divided by twice the intensity of the polarization current of the transistors making up the stage X, this current being dependent on the polarization current $I_i$ of the conveyor i, we thus simply obtain $I_{z2} = I_e \cdot I_2 / I_1$. It can thus be seen that we obtain a current amplifier whose gain is dependent on the ratio of the polarization currents of the two conveyors 10 and 20.

Such a controllable-gain current amplifier can be easily used in an automatic gain-control loop. This amplifier can also be used as a mixer when the current source 14 is a source of alternating current and the polarization current $I_2$ of the second conveyor 20 consists of a continuous current to which is added an alternating current. Indeed, by writing $I_2 = I_0 + I_{mod} \sin(W_{LO} t)$, and $I_e = I_i \sin(W_0 t)$, we obtain:

$$I_{z2} = \frac{I_i I_0}{I_1} \sin(W_o t) + \frac{I_i I_{mod}}{2 I_1} [\cos(W_0 - W_{20})t - \cos(W_0 - W_{20})t]$$

In an alternate embodiment of the controllable-gain current amplifier, the ports $Z_1$ and $Y_1$ can be connected together as indicated by the dashed line in FIG. 4.

Figure 5:
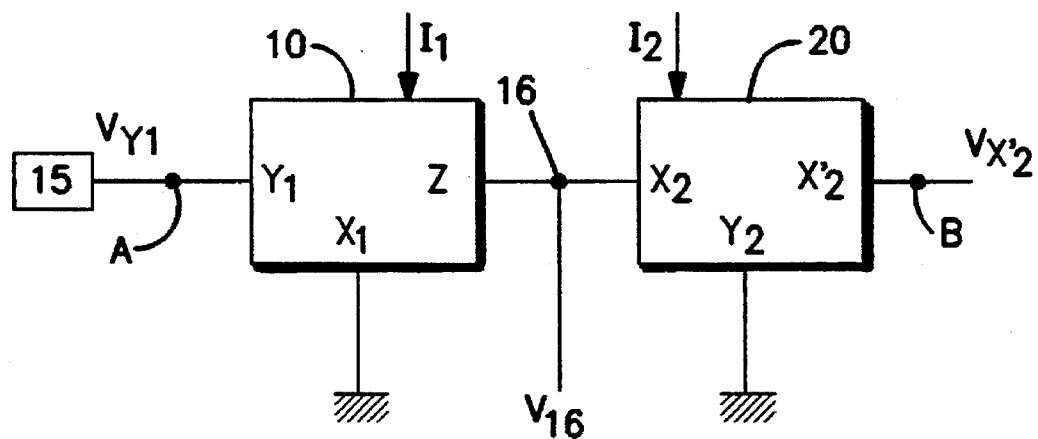
FIG. 5 is a schematic representation of an electronic circuit comprising two current conveyors connected so as to make up a controllable-gain voltage amplifier.

Referring to FIG. 5, the electronic circuit shown makes up a controllable-gain voltage amplifier. In FIG. 5, the input port $X_1$ of the first conveyor 10 is connected to ground, the reference port $Y_1$ is connected to a voltage source 15 and the output port $Z_1$ is connected to the input port $X_2$ of a second second-generation current conveyor 20. This second conveyor 20 further includes a second input port $X'_2$ which duplicates the voltage at the junction point 16. The current at port $Z_1$ can be written as follows:

$$I_{z1} = V_{y1} / R_1$$

Similarly, we can write that the voltage $V_{16} = R_2 \cdot I_{z1}$, so that by combining the two formulas we obtain:

$$V_{16} = (R_2 / R_1) \cdot V_{y1}$$

As indicated, the voltage $V_{16}$ at the input port $X_2$ is duplicated, according to a known principle, onto port $X'_2$, whereby $$V_{16} = V_{x2} = (R_2 / R_1) \cdot V_{y1}$$

Since, as previously indicated, the two resistances are each dependent on the polarization current, we thus obtain:

$$V_{16} = V_{x2} = (I_1 / I_2) \cdot V_{y1}$$

The circuit is therefore a voltage amplifier whose gain is dependent on the ratio of the polarization currents of the two conveyors 10 and 20.

Figure 6:
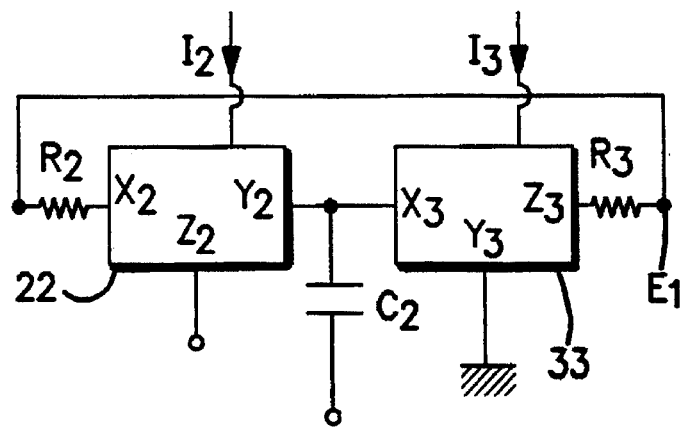
FIG. 6 is a schematic representation of an electronic circuit making up a self-inductance simulation circuit according to the invention.

Referring to FIG. 6, the electronic circuit shown makes up a self-inductance simulation circuit.

It comprises a second 22 and third 33 second-generation current conveyor of the same type as the first conveyor 10 previously described.

In the exemplary embodiment shown, the reference port Y2 of the second conveyor 22 can be connected to ground, via a second capacitor C2, particularly if it is not used at the output and/or if it is not connected to a device with a low-impedance with respect to the ground, and the output port Z2 can be connected to ground, particularly if it is not used at the output and/or if it is not connected to a device with a low-impedance with respect to the ground.

The third conveyor 33 has its output port Z3 connected to the reference port Y2 of the second conveyor 22, while its reference port Y3 is connected to ground.

The input terminal E1 of the self-inductance simulation circuit consists of the connecting point between the input port X2 of the second current conveyor and the input port X3 of the third current conveyor.

It is obvious that the self-inductance simulation circuit displays a particular configuration of the two conveyors which it is made up of, but that these conveyors can display other configurations by applying permutations of ports X-Y or X-Z at one or the other of the conveyors, each conveyor being of either CCII+ or CCII− type.

Thus, either one of the input X2 or reference port Y2 of the second conveyor is connected to either one of the input X3 or output port Z3 of the third conveyor, and the input terminal E1 of the self-inductance simulation circuit consists of the connecting point between either one of the input X2 or output port Z2 of the second conveyor and either one of the input X3 or reference port Y3 of the third conveyor.

Figure 7:
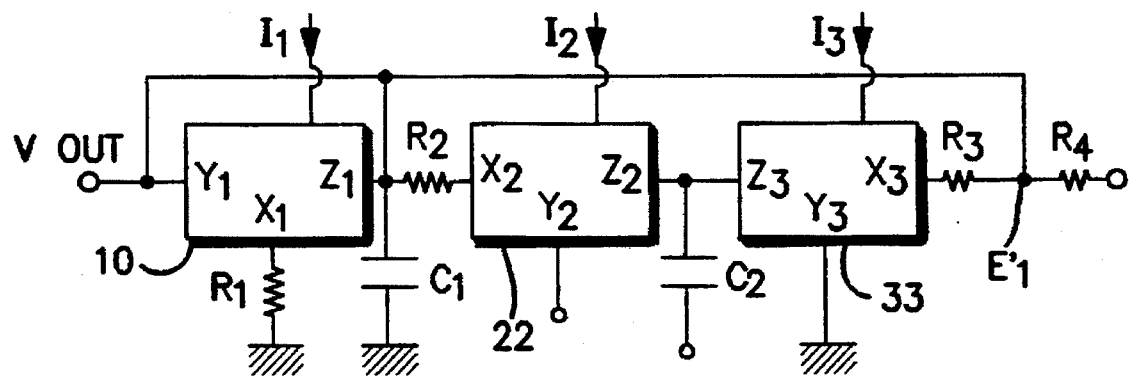
FIG. 7 is a schematic representation of an electronic circuit comprising three current conveyors and making up an adjustable bandpass filter.

Referring to FIG. 7, the electronic circuit shown makes up an adjustable bandpass filter and comprises three current conveyors of which the first, indicated by reference number 10, embodies a negative resistor as previously indicated with reference to FIG. 3b. Thus, this first conveyor 10 has its output port $Z_1$ connected to the reference port Y1 while its input port $X_1$ is connected to ground. The output port $Z_1$ of the first conveyor 10 is further connected to ground via a first capacitor $C_1$.

This bandpass filter further includes two other current conveyors 22, 23 which embody a self-inductance simulation circuit such as previously described with reference to FIG. 6.

The input E1 of the self-inductance simulation circuit is therefore connected, on the one hand, to the output port Z1 of the first conveyor 10 and, on the other hand, to a terminal of a resistor R4 whose other terminal makes up a free terminal of circuit making up the bandpass.

According to a first embodiment, the bandpass filter is in voltage mode. Thus, the input of the circuit consists of the free terminal of the resistor R4 to which an input voltage Vin is applied, while the output of the circuit consists of the reference port Y1 of the first conveyor 10 from which an output voltage Vout is drawn.

According to a second embodiment, the bandpass filter is in current mode. In this case, the input of the circuit consists of the input port Y1 of the first conveyor 10 to which an input current Iin is applied, and the output of the circuit consists of the free terminal of the resistor R4 from which an output current Iout is drawn.

Figure 8:
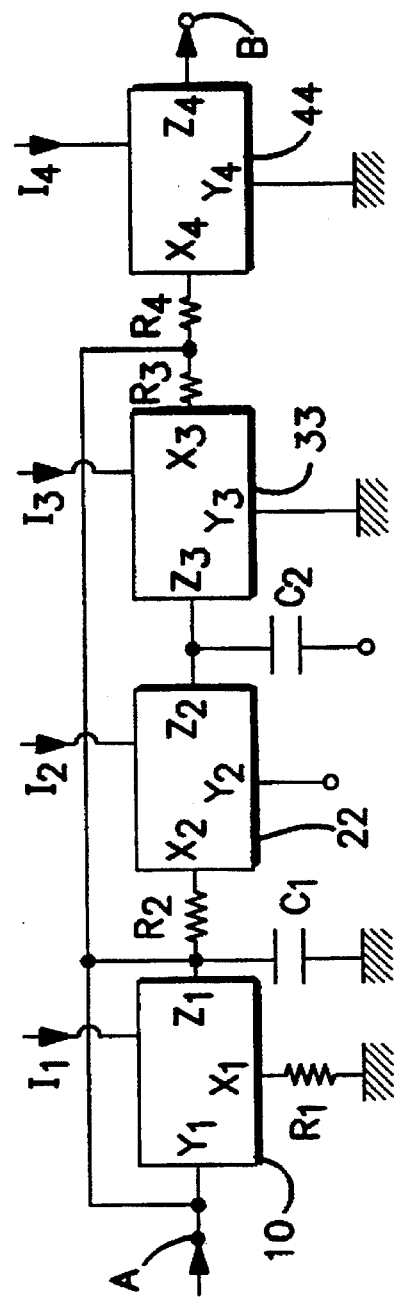
FIG. 8 is a schematic representation of an electronic circuit comprising four current conveyors and making up an adjustable bandpass filter in current mode.

Referring to FIG. 8, the electronic circuit shown is a bandpass filter in current mode. It includes a fourth conveyor 44 which has its input port X4 connected to the free terminal of the resistor R4, while its reference port Y4 is connected to ground. This circuit therefore has an input which consists of the reference port Y1 of the first conveyor 10, and an output consisting of the output port Z4 of the fourth conveyor 44. The input current Iin is therefore applied to the input port Y1 of the first conveyor 10, while the output current Iout is drawn from the output port Z4. This fourth conveyor 44 mainly serves as an impedance corrector.

The resistors R1, R2, R3 shown in the diagrams in FIGS. 6, 7 and 8 essentially represent the internal resistance of each of the corresponding conveyors, to which can be added, if necessary, a physical resistor. We thus obtain, in the case of FIG. 8, a second-order bandpass filter with the following characteristics:

center frequency $W0 = 1/\phi(C1 \times C2 \times R2 \times R3)$, quality coefficient $Q = \phi(C1/C2) \times [1/(1/R2 + 1/R3 + 1/R4 - 1/R1) \times \phi(R2 \times R3)]$ and gain G $G = 1/[R4(1/R2 + 1/R3 + 1/R4 - 1/R1)]$ Since each of the resistors R1, R2, R3 and R4 consist of at least the value of the internal resistance of each corresponding conveyor between the input port and the reference port, we thus obtain a bandpass filter all of whose parameters (frequency, quality coefficient, and gain) can be adjusted according to the polarization currents of each of the conveyors.

This filter architecture makes it possible to obtain other types of filters. As a non limiting example, by using the output port Z2 of the conveyor 22, we obtain a second-order low-pass output. Similarly, the current delivered by the terminal of the capacitor $C_1$ which is not connected to the output port $Z_1$ of the conveyor 10 makes up a second-order high-pass output, while the current delivered by the terminal of the capacitor $C_2$ which is not connected to the reference port $Y_2$ of the second conveyor 22 also makes up a second-order bandpass output.

Although only certain embodiments of the invention have been described, it is obvious that any modification performed within the same spirit will not depart from the scope of the present invention. For example, all of the circuits suggested can be embodied using MOS, FET ASGA or HBT technologies, or by associating several technologies within the same spirit.

We claim:

1. In an electronic circuit comprising at least one first second-generation current conveyor (10) made up of a mixed translinear loop and a plurality of current mirrors, said conveyor (10) having a high-impedance reference port ($Y_1$), an input port ($X_1$) with an intrinsic resistance (R) equivalent to the output resistance of the equivalent Thevenin-type generator at said input port ($X_1$) and which is polarized by a polarization current ($I_1$), an output port (Z1) whose current corresponds to that of the input port (X1), and means to control the intensity of the polarization current ($I_1$), so as to determine the ohmic value of said intrinsic resistance (R), the improvement wherein the reference ($Y_1$) and output port ($Z_1$) are directly connected together.

2. An electronic circuit according to claim 1, wherein at least one of the ports is connected to ground.

3. An electronic circuit according to claim 1, wherein said input port ($X_1$) is connected to a source of current (14) and to the reference port ($Y_2$) of a second second-generation current conveyor (20) similar to the first conveyor (10), whose input port ($X_2$) is connected to ground in such a way that the current applied to the output port ($Z_2$) of the second conveyor (20) is equal to the current ($I_e$) delivered by said source of current (14) multiplied by a multiplying coefficient dependent on the ratio of the polarization currents of each of said conveyors (10, 20).

4. An electronic circuit according to claim 2, wherein said input port ($X_1$) is connected to ground, the reference port ($Y_1$) is connected to a voltage source (15), and the output port ($Z_1$) is connected to the input port ($X_2$) of a second second-generation current conveyor (20) including, in addition to a reference port ($Y_2$) connected to ground, a second input port ($X_{2'}$) which duplicates the input voltage of the input port ($X_2$) in such a way that the voltage at the input port ($X_{2'}$) of the second conveyor is equal to the voltage ($V_{Y1}$) delivered by the source of voltage (15) multiplied by a coefficient dependent on the ratio of the polarization currents of each of said conveyors (10, 20).

5. An electronic circuit according to claim 3, wherein the polarization current ($I_2$) of said second conveyor (20) and the current ($I_e$) delivered by said source of current (14) are alternating currents.

6. In an electronic circuit making up a self-inductance simulation circuit, including an input terminal (E1), comprising a second (22) and third (33) second-generation current conveyors respectively made up of a mixed translinear loop and a plurality of current mirrors, the conveyors respectively having a high-impedance reference port (Y2, Y3), an input port (X2, X3) with an intrinsic resistance (R) equivalent to the output resistance of the equivalent Thevenin-type generator, at the input port (X2, X3), and being respectively polarized by a polarization current (I2, I3), and an output port (Z2, Z3) whose current corresponds to that of the input port, and means to control the intensity of the polarization currents (I2, I3) so as to determine the ohmic value of said intrinsic resistance (R), the improvement wherein either one of the input (X2) or reference (Y2) port of the second conveyor (22) is connected to one terminal of a capacitor (C2) whose other terminal is connected to ground, and is connected to either one of the input (X3) or output (Z3) port of the third conveyor (33), and the input terminal (E1) of the self-inductance simulation circuit consisting of the connecting point between either one of the input (X2) or output (Z2) port of the second conveyor (22) and either one of the input (X3) or reference (Y3) port of the third conveyor (33).

7. An electronic circuit according to claim 6 further comprising a first second-generating current conveyor (10) whose output ($Z_1$) and reference ($Y_1$) ports are connected to ground via a first capacitor ($C_1$), while the input port ($X_1$) is directly connected to ground, and the input terminal (E1) of the simulation circuit is connected to the connecting point between the first capacitor (C1) and the output (Z1) and reference (Y1) ports of the first conveyor (10) and to a terminal of a resistor (R4), so as to thus embody a bandpass filter whose characteristics can be adjusted by modifying at least one of the polarization currents applied to said conveyors.

8. An electronic circuit according to claim 7, characterised in that the input of the circuit consists of the free terminal of the resistor (R4) to which an input voltage (Vin) is applied; while the output of the circuit consists of the reference port (Y1) of the first conveyor from which an output voltage (Vout) is drawn, so as to thus embody a bandpass filter in voltage mode, whose characteristics can be adjusted by modifying at least one of the polarization currents applied to said conveyors.

9. An electronic circuit according to claim 7, characterised in that the input of the circuit consists of the input port (Y1) of the first conveyor (10) to which an input current (Iin) is applied, and the output of the circuit consists of the free terminal of the resistor (R4) from which an output current (Iout) is drawn, so as to thus embody a bandpass filter in current mode, whose characteristics can be adjusted by modifying at least one of the polarization currents applied to said conveyors.

10. An electronic circuit according to claim 7, characterised in that it further comprises a fourth second-generation current conveyor (44) of the same type as the first conveyor (10), whose input port (X4) is connected to the free terminal of the resistor (R4), the reference port (Y4) being connected to ground, the output of the circuit consisting of the output port (Z4) of said fourth conveyor (44) from which an output current (Iout) is drawn, while the input of the circuit consists of the input port (Y1) of the first conveyor (10) to which an input current (Iin) is applied, so as to thus embody a bandpass filter in current mode, whose characteristics can be adjusted by modifying at least one of the polarization currents applied to said conveyors.

* * * * *